(12) United States Patent
Ghose et al.

(10) Patent No.: US 12,339,298 B2
(45) Date of Patent: Jun. 24, 2025

(54) METHOD OF CTLE ESTIMATION USING CHANNEL STEP-RESPONSE FOR TRANSMITTER LINK EQUALIZATION TEST

(71) Applicant: Tektronix, Inc., Beaverton, OR (US)

(72) Inventors: Subhankar Ghose, Bengaluru (IN); Ankit Dash, Bengaluru (IN); David M. Bouse, Camas, WA (US); Pradeep Joshi, Bengaluru (IN)

(73) Assignee: Tektronix, Inc., Beaverton, OR (US)

( * ) Notice: Subject to any disclaimer, the term of this patent is extended or adjusted under 35 U.S.C. 154(b) by 91 days.

(21) Appl. No.: 18/059,297

(22) Filed: Nov. 28, 2022

(65) Prior Publication Data

US 2023/0204629 A1 Jun. 29, 2023

(30) Foreign Application Priority Data

Dec. 29, 2021 (IN) .............................. 202121061575

(51) Int. Cl.
| | | |
|---|---|---|
| *G01R 13/34* | (2006.01) | |
| *G01R 19/25* | (2006.01) | |
| *G01R 31/28* | (2006.01) | |
| *G01R 31/317* | (2006.01) | |
| *G01R 31/3187* | (2006.01) | |
| *G01R 31/319* | (2006.01) | |

(52) U.S. Cl.
CPC ......... *G01R 13/34* (2013.01); *G01R 19/2509* (2013.01)

(58) Field of Classification Search
CPC ........ G01R 13/34; G01R 19/25; G01R 31/28; G01R 31/317; G01R 31/319; G01R 31/3187
See application file for complete search history.

(56) References Cited

U.S. PATENT DOCUMENTS

| | | | | |
|---|---|---|---|---|
| 2015/0054492 | A1* | 2/2015 | Mende ................. | G01R 15/125 324/115 |
| 2015/0301109 | A1* | 10/2015 | O'Flynn ............ | G01R 31/3191 324/750.02 |
| 2016/0006589 | A1* | 1/2016 | Kamali ................... | H04L 27/01 375/232 |
| 2019/0383873 | A1* | 12/2019 | Hojabri .............. | G01R 31/3187 |

* cited by examiner

*Primary Examiner* — Neel D Shah
(74) *Attorney, Agent, or Firm* — Miller Nash LLP; Andrew J. Harrington

(57) ABSTRACT

A method of automatically selecting a continuous time linear equalization (CTLE) filter includes capturing a response waveform for a channel of a communication link of a device under test (DUT), generating a set of candidate CTLEs, and automatically selecting the CTLE from the set of candidate CTLEs using the response waveform. A test and measurement instrument has a user interface, a port to allow the instrument to connect to a device under test (DUT), and one or more processors configured to execute code to cause the one or more processors to: generate a set of CTLE candidates; capture a response waveform for the channel; and automatically select the CTLE from the set of candidate CTLEs using the response waveform.

18 Claims, 10 Drawing Sheets

METHOD OF CTLE ESTIMATION USING CHANNEL STEP-RESPONSE FOR TRANSMITTER LINK EQUALIZATION TEST

CROSS-REFERENCE TO RELATED APPLICATIONS

This disclosure claims benefit of Indian Provisional Application No. 202121061575, titled "A Method of CTLE Estimation Using Channel Step-Response for PCIe Transmitter Link Equalization Test," filed on Dec. 29, 2021, the disclosure of which is incorporated herein by reference in its entirety.

FIELD OF THE INVENTION

The present invention relates generally to continuous time linear equalization (CTLE) of transmitter links, and more particularly, to a method of CTLE estimation using channel step-response.

BACKGROUND

Generally, testing high speed transmitting devices operating at speeds of 16 GTps (gigatransfers per second, also GT/s), 32 GTps and above, require the testing of a protocol response time. These devices may include PCIe devices, devices manufactured in accordance with IEEE standards such as the IEEE 802.3x standard for Ethernet networks. Broadly speaking, protocol response time indicates how quickly a transmitting device can respond to a request for change in protocol, during the link training procedure. With increasing data rates and corresponding increases in channel losses, identifying the protocol response time becomes challenging due to waveform shape distortion and therefore lack of proper identification of the logical bit levels.

As an example, a part of the PCIe compliance test under the category of transmitter link equalization test (referred to as the Tx LEQ test) includes the protocol response time calculation. To evaluate the protocol response time, the protocol traffic is analyzed on a RT-Scope (real-time oscilloscope) using a protocol decoder. The fidelity of the protocol traffic limits performance of the decoder. The losses encountered in the path leading to the data acquisition module of the RT scope affect the fidelity of the traffic.

Currently, a laborious approach to decode a protocol traffic involves manually searching the most effective software channel equalizer or CTLE and then running the protocol traffic through it to improve the bit transition edges. This facilitates an improved identification of the logical levels of the bits. Another approach uses a hardware CTLE, which is not only lossy but also has a highly limited equalization range of operations and hence not considered here.

A software CTLE offers more flexibility than a hardware CTLE for the protocol traffic analysis at high speeds. It still suffers from the fact that the user must have a priori knowledge of (1) the channel behavior and (2) the "optimum" CTLE to compensate the channel using knowledge from (1).

FIG. 1 shows a process for performing link testing without CTLE. The test begins at 10, and the link training between the device under test (DUT) and a piece of test equipment, in this case a bit error ratio tester (BERT) begins as 12. Link training generally involves a physical layer process that configures a device's physical layer, port and the associated link so that normal traffic can proceed. The oscilloscope acquires the protocol traffic at 14 and runs a decoder to identify the protocol response time. When the channel losses are high, not applying a CTLE is detrimental and leads to wrong results. Therefore, the process of FIG. 1 would not suffice.

FIG. 2 shows a flowchart for the manual process discussed above. The specification for which the test is being performed may provide a recommended set of CTLEs to equalize the channel. The direct application of the recommended CTLEs does not deal with the wide range of channels encountered in practice during the test. Further, the user has no way to determine the optimum CTLE that will improve the protocol traffic waveshape without risking over-equalization of the channel. Over-equalization can interfere with the receiver's ability to recover the data begin transmitted. Selection of the right CTLE considering over-equalization presents a difficult proposition without automation.

With the recommended set of CTLEs loaded in the oscilloscope, the test begins at 20 in FIG. 2, and link training begins at 22. The RT scope acquires the traffic at 24. The user manually selects the CTLE to apply to the traffic at 26, and then analyzes the protocol traffic after equalization at 28 to see if the protocol traffic has improved. The user repeats this process until they have identified a "best" or optimal CTLE. The process then applies this CTLE to the protocol traffic at 30, and then the decoder runs to determine the protocol response time at 32.

Therefore, there is a need in the art for a method and system that improves the process of CTLE estimation.

DETAILED DESCRIPTION

The various embodiments describe a system and method of automatic CTLE (continuous time linear equalization) estimation using the channel step-response for transmitter link equalization tests set out in various standards, such as PCIe (Peripheral Component Interconnect Express), IEEE Ethernet standard 802.3x, and USB (Universal Serial Bus), as examples.

However, the systems and methods are not limited to the specific embodiments described herein. Further, structures and devices shown in the figures are illustrative of exemplary embodiments of the presently disclosure and are meant to avoid obscuring of the presently disclosure.

The present embodiments provide a method which enables a fast, automatic, and highly accurate software CTLE estimation with control over one of the degrees of freedom, particularly the DC (direct current or steady state) gain, ADC_Gain. It is a trivial extension to control the other degrees of freedom like poles and zeros, which contributes to the CTLE transfer function. However, for the embodiments here and the factors under consideration, control over DC gain suffices.

The embodiments have a wide range of applications involving channel equalization, and an optimal CTLE is sought after with poles, zeros and the ADC_Gain being the tunable parameters.

As used here, the term CTLE may refer to the overall process of equalization. Individual instances of CTLE, particular sets of poles and zeros for use in the CTLE function to be applied to the signals, may be referred to as CTLEs, or an individual CTLE.

In the embodiments, the entire software CTLE selection procedure is fully automated with a software decision on CTLE requirement to avoid over-equalization and identification of cases where CTLE is not required. Although different specifications may provide a set of recommended CTLEs to equalize the channel, a direct application of those CTLEs in Tx LEQ test, poses two challenges. First, the recommended set of CTLEs do not deal with the wide range of channels that are encountered in practice during the test. Second, the user can no way infer the optimum CTLE that will improve the protocol traffic waveshape without risking over-equalization of the channel.

The below discussion uses the equalization of a channel under the standard for PCIe for understanding of the embodiments. No limitation to such a particular embodiment is intended. Any system that can find the step response waveform for a channel and has a list of candidate CTLEs could employ the embodiments.

The behavioral CTLE model for PCIe Gen 5 at 32 GTps provided in the specification is mentioned below as an example. It is observed that the zero, $f_{Z2}$, is a function of the ADC_Gain while others are fixed.

$$H(s) = \frac{f_{P1} \times f_{P3} \times f_{P4}}{f_{Z1}} \times \frac{(s + f_{Z1}) \times (s + f_{P2} \times \text{ADC\_Gain})}{(s + f_{P1}) \times (s + f_{P2}) \times (s + f_{P3}) \times (s + f_{P4})}$$

Figure 1:
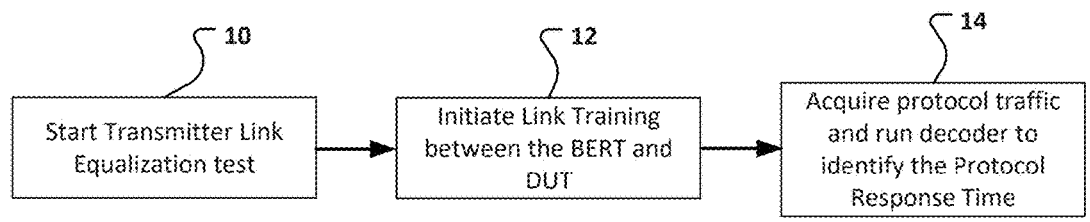
FIG. 1 shows a flowchart of an example of a method of determining protocol response time on a communications link without applying continuous time linear equalization CTLE.
Figure 2:
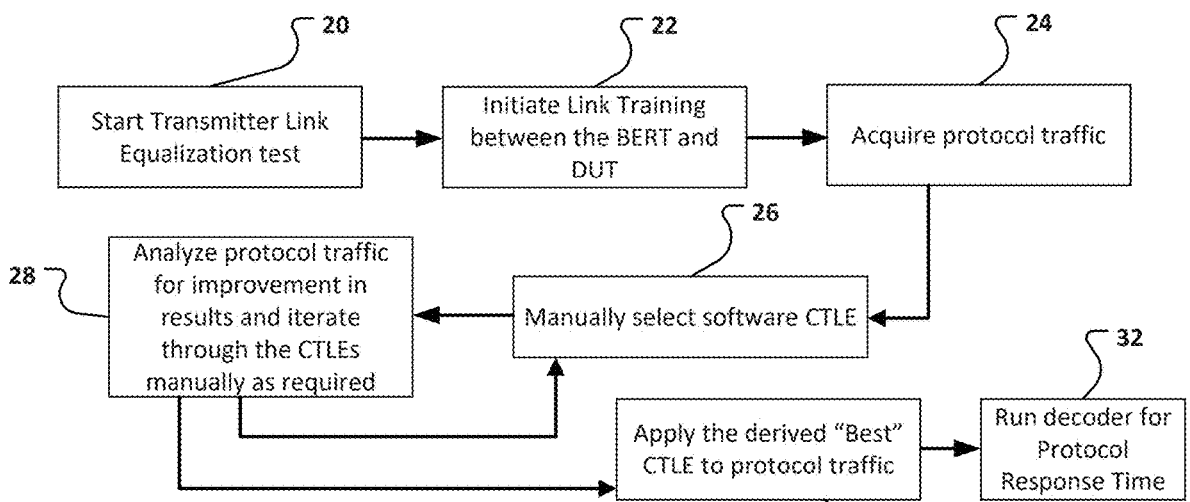
FIG. 2 show flowchart of an example of a method of determining protocol response time on a communications link applying manually determined CTLE.
Figure 3:
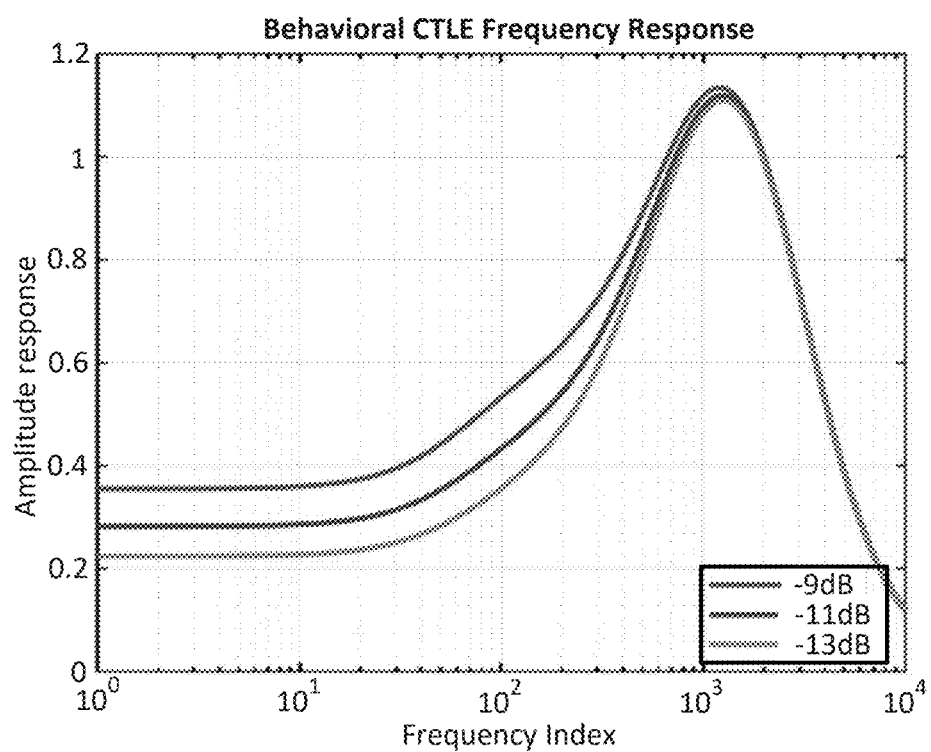
FIG. 3 shows a graph of CTLE frequency response for different gains in analog-to-digital converter (ADC) gains.

Where, the following definitions are used:
a) $f_{P1} = 1.65 \times f_{Z1}$
b) $f_{P2} = 9.5$ GHz
c) $f_{P3} = 28$ GHz
d) $f_{P4} = 28$ GHz
e) $f_{Z1} = 450$ MHz
f) $f_{Z2} = |\text{ADC\_Gain}| \times f_{P2}$ FIG. 3 shows the typical CTLE frequency response for ADC_Gain of −9 dB, −11 dB and −13 dB. As ADC_Gain is varied, the zero ($f_{Z2}$) shifts in position that modifies the initial rising portion of the slope in the response curve. Although the CTLE frequency response is specified with adjustable poles and zeros along with the ADC_Gain, what suffices for this work under consideration is a variation in the ADC_Gain alone to achieve the desired result. Note that, variation in ADC_Gain also modifies the location of $f_{Z2}$. The problem of identifying the optimum CTLE can therefore be represented as choosing the optimal ADC_Gain.

Figure 4:
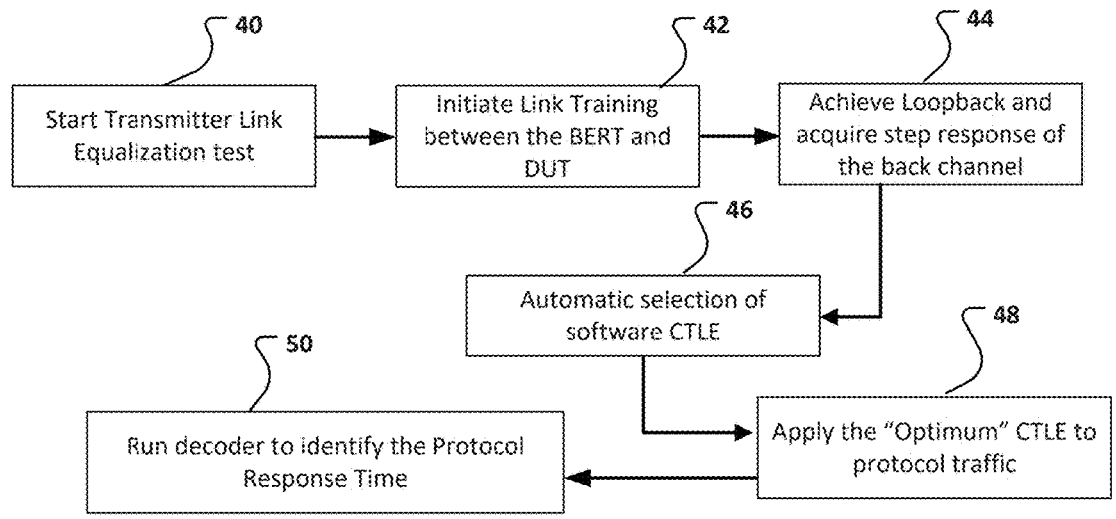
FIG. 4 shows a flowchart of an embodiment of a method of determining protocol response times using automated CTLE.

FIG. 4 shows a flowchart of an embodiment of a procedure to automatically select the optimal CTLE during the protocol traffic analysis. The sequence begins at 40 with Start Transmitter Link Equalization test, and Initiate Link Training between the BERT and DUT at 42. Generally, the BERT will generate the signal to request that the DUT change protocols. A test and measurement instrument, typically an oscilloscope although no limitation to that instrument is intended, will receive both sides of the communications, from both the BERT and the DUT, called loopback. The process achieves loopback between the DUT and the BERT at 44, and the step response of the channel is acquired. The system then performs automatic selection of the software CTLE, which may be a menu option on a user interface of the instrument. Once selected, the optimal CTLE is applied to the protocol traffic at 48 and the protocol decoder runs at 50.

Figure 5:
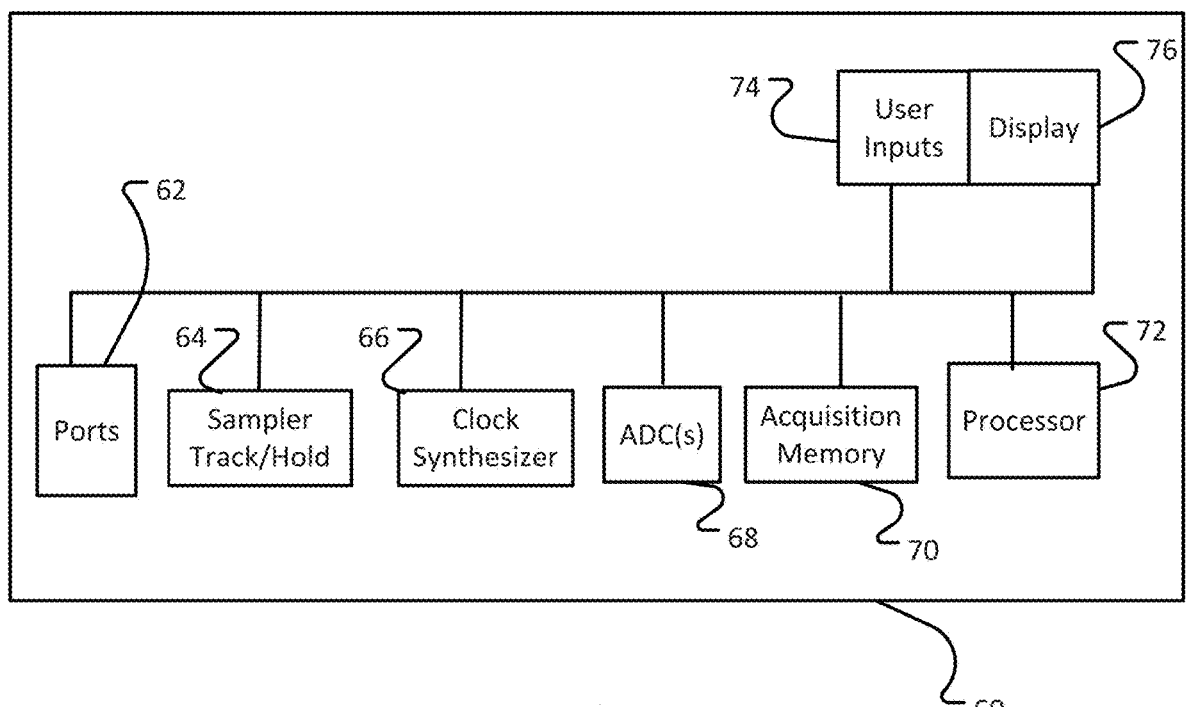
FIG. 5 shows an embodiment of a test and measurement device to apply automated CTLE to protocol traffic.

FIG. 5 shows an embodiment of a test and measurement instrument that can automatically select the optimal CTLE. The test and measurement instrument 60 includes one or more ports 62, which may be any electrical signaling medium or optical signaling converted to electrical. Each port 62 may comprise a channel of the test and measurement instrument 60.

A port 62 receives a signal from a device under test (DUT) and sends it to a sampler track and hold circuit 64. The track and hold circuit 64 tracks and holds each signal steady for a period of time sufficient to enable analog to digital conversion by one or more high-resolution analog-to-digital converter(s) (ADC) 68. The ADC may receive a sample clock from the clock synthesizer 66 under control of one or more processors 72.

The ADC 68 converts the analog signal from the track and hold circuit 64 to a digital signal. The ADC 68 has a sampling rate, discussed in more detail below. For example, the ADC 68 can sample the signals from a few GS/s to hundreds of GS/s. In some configurations, the ADC 68 can sample the analog signal between 1 GS/s to 200 GS/s. In other configurations, the ADC 68 can sample the analog signal between 2 GS/s and 25 GS/s. The digitized signal from the ADC 68 can then be stored in an acquisition memory 70.

The one or more processors 72 may be configured to execute instructions from memory and may perform any methods and/or associated steps indicated by such instructions. In one embodiment, the one or more processors take the digitized waveform, generate the CTLE value(s) and store them in the memory 70, or any other memory on the test and measurement instrument 60. The memory may be implemented as processor cache, random access memory (RAM), read only memory (ROM), solid state memory, hard disk drive(s), or any other memory type. Memory acts as a medium for storing data, computer program products, and other instructions.

User interface 74 is coupled to the one or more processors 72. User interface 74 may include a keyboard, mouse, trackball, touchscreen, and/or any other controls employable by a user to interact with a GUI on the display 76. The display 76 may be a digital screen, a cathode ray tube based display, or any other monitor to display waveforms, measurements, and other data to a user.

The user interface of the test and measurement instrument may provide a menu of options for the user for this test. One of those may include a selection to automate the CTLE selection. This then causes the process 46 to begin as shown in FIG. 4. At the beginning of the procedure, a list of CTLEs is generated based upon the specification and stored in memory as candidate CTLEs to be used during the optimization procedure. To achieve this, ADC_Gain is varied over a range with a user-defined granularity that may designated on the user interface of the instrument.

Once the automated process begins, the corresponding CTLE frequency responses, one for each of the candidate CTLEs, $H_i(s) \forall i: 1 \to N$, are computed and stored. Using Inverse Fast Fourier Transform (IFFT), the time-domain impulse response is computed for each CTLE, as shown below.

$$h_i(t) = \text{IFFT}\{H_i(s)\} \forall i: 1 \to N$$

Information regarding the channel is acquired through a step-response of the channel since it contains all the relevant information for further processing.

Consider a time-domain channel step response waveform S(t) with a sufficiently long steady-state portion. The following operations are performed on the step response waveform. One should note that the response of the channel used here is the step response, which is used to determine the channel impulse response. However, other types of responses could be used to determine the channel impulse response. No intention to limit the channel response used to determine the channel impulse response is intended, nor should it be implied. First, only the samples capturing the transient and the steady-state portion of the step-response waveform are considered for analysis. Second, the y-axis is normalized to fall within the range [0,1]. Third, the impulse response r(t) is computed using the following relation:

$$r(t) = \frac{d}{dt}(S(t))$$

Figure 6:
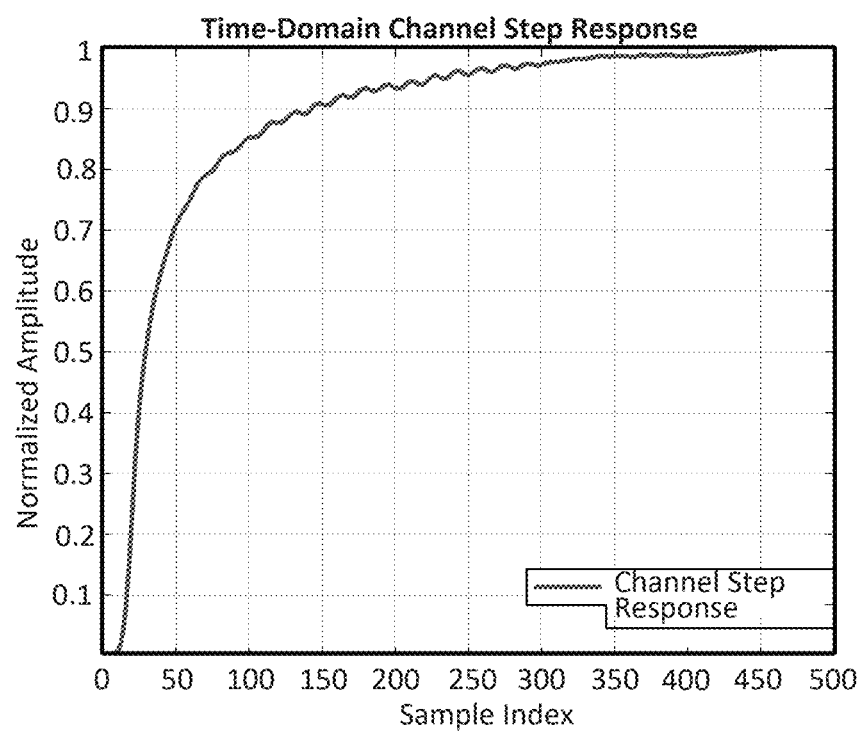
FIG. 6 shows a graph of a normalized channel step-response S(t).
Figure 7:
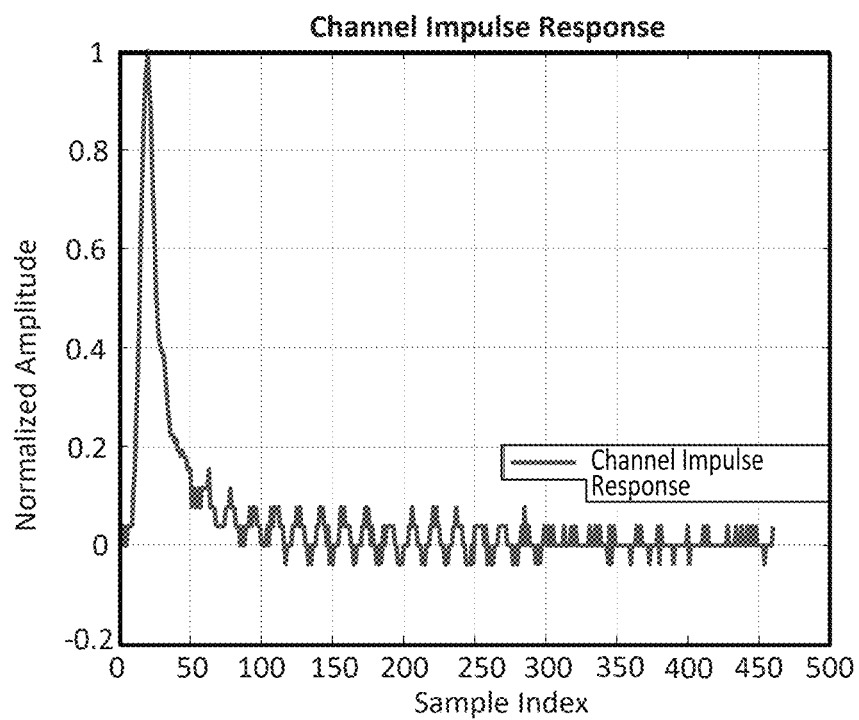
FIG. 7 shows a graph of a normalized channel impulse response r(t).

FIGS. 6 and 7 show the processed step-waveform and the corresponding impulse response respectively for a channel that is typical for PCIe Gen 5 at 32 GTps.

As the second step, r(t), which is the time-domain impulse response of the channel, derived from S(t), is convolved with the time-domain impulse responses for each candidate CTLE, $h_i(t) \forall i: 1 \to N$, producing N-equalized results $p_i(t)$ i: $1 \to N$ $$p_i(t) = r(t) * h_i(t) \forall i: 1 \to N \quad \text{Eq (1)}$$

Figure 8:
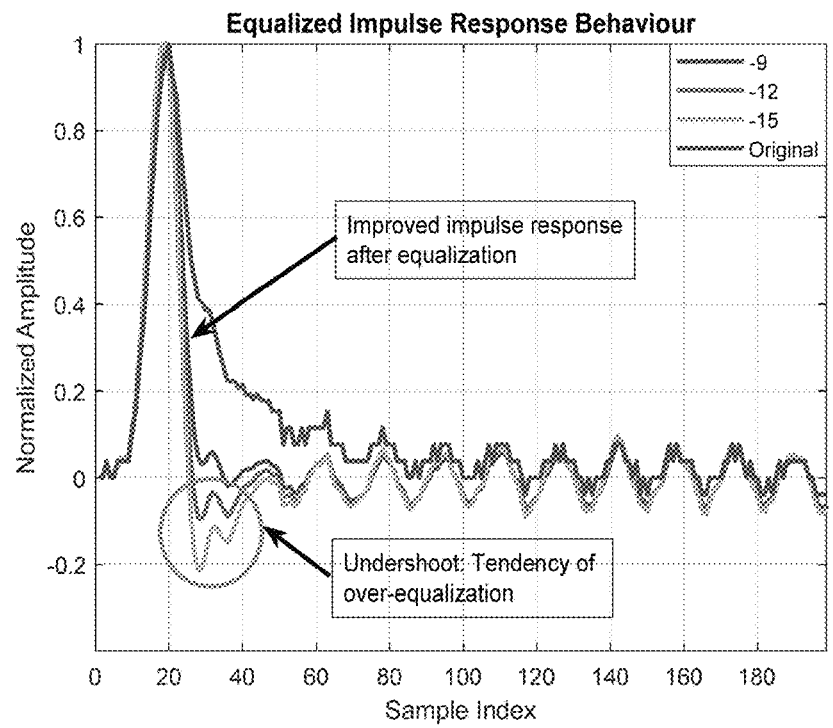
FIG. 8 shows a graph of normalized and equalized impulse responses with different software CTLEs.

In case the channel is exactly equalized, i.e., $h_k(t)$ is the "Inverse" of r(t), then $p_k(t) = \delta(t)$, for some i=k, an impulse that would yield a corresponding step response with no rise time. In practice, this is not possible to achieve and hence the overall responses $p_i(t)$, tend to the theoretical result of $\delta(t)$, as the channel equalization improves. This behavior is shown in FIG. 8 for a real physical channel with CTLEs −9 dB, −12 dB and −15 dB.

The CTLEs are chosen as such to highlight two different aspects. First, it shows the improvement in impulse response of the channel with application of CTLEs, which is expected and secondly, the appearance of enhanced undershoot with increase in |ADC_Gain| of the CTLE. It is indicative of over-equalization and hence not desirable.

The third step involves deriving the equalized step response from the equalized impulse response of Eq (1), to evaluate two different metrics of optimality as described below. The reason for considering the equalized step response for further processing in lieu of the equalized impulse response is because the latter suffers from distortions in presence of reflections, undershoot, etc. as seen in FIG. 8, while the step response offers a more practical way to evaluate the optimality metrics.

Using $p_i(t) \forall i: 1 \to N$ obtained earlier in Eq (1), the process re-creates and store the step waveforms $Q_i(t)$ calculated from the equalized impulse response $p_i(t)$ as shown below.

$$Q_i(t) = \int_{-\infty}^{t} p_i(\alpha) d\alpha \quad \forall i: 1 \to N \quad \text{Eq (2)}$$

The process then calculate the frequency response from the equalized impulse response $p_i(t)$ as shown below using the Fast Fourier Transform (FFT).

$$P_i(\omega) = \text{FFT}\{p_i(t)\} \forall i: 1 \to N \quad \text{Eq (3)}$$

Figure 9:
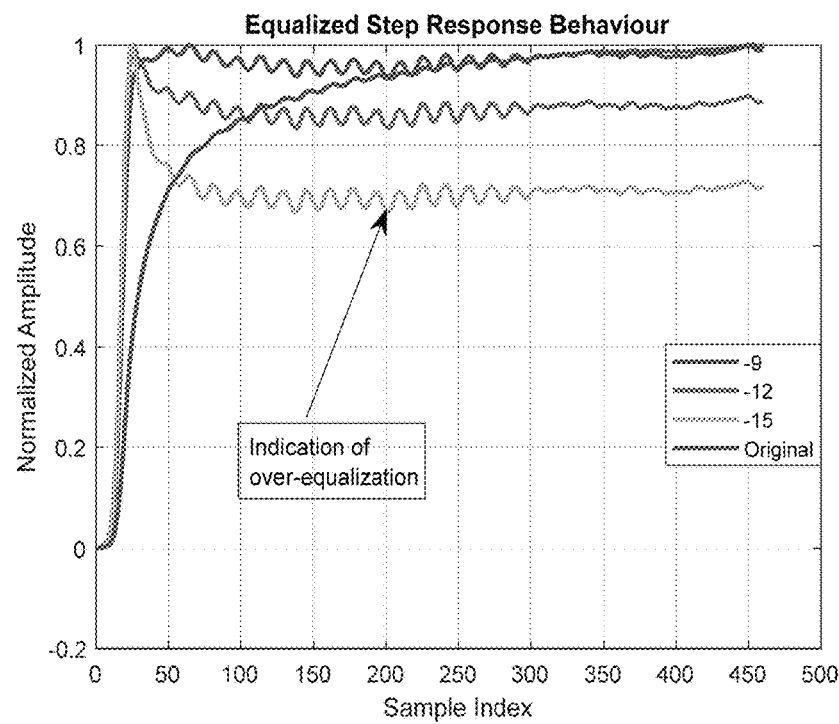
FIG. 9 shows a graph of normalized and equalized step responses with the original channel step responses with different software CTLEs.

FIGS. 8 and 9 show the set of recreated step responses and frequency responses along with the original channel step and frequency response for comparison with CTLE −9 dB, −12 dB and −15 dB.

Figure 10:
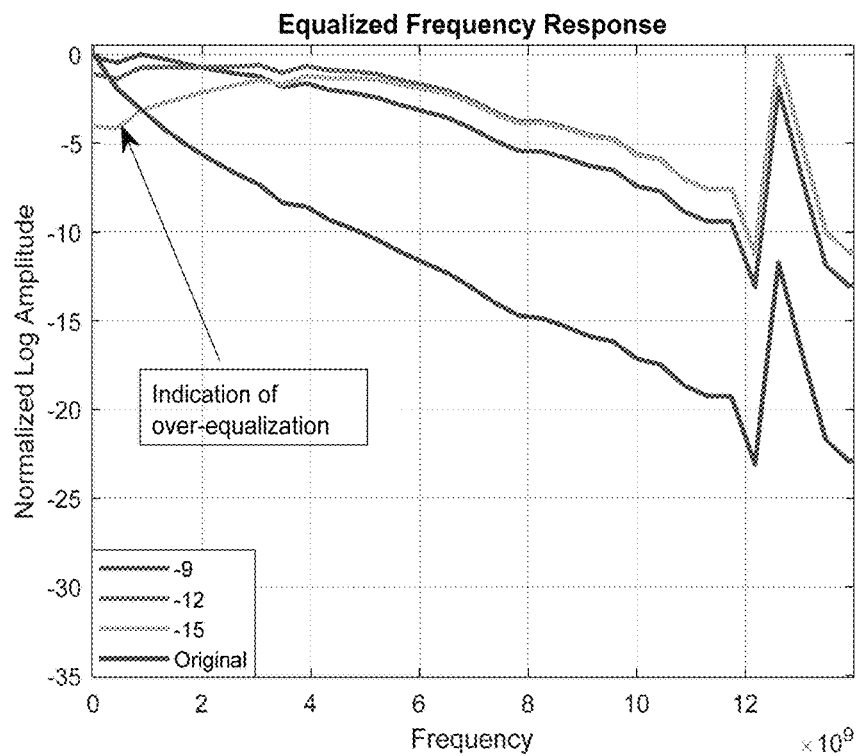
FIG. 10 shows a graph of normalized and equalized frequency responses with the original channel step responses with different software CTLEs.

FIG. 8 shows normalized and equalized step responses, $Q_i(t)$: i=1, 2 & 3 and the original channel step response S(t) with different software CTLE and the FIG. 10 shows normalized and equalized frequency responses, $P_i(\omega)$: i=1, 2 & 3 and the original channel frequency response with different software CTLE.

The embodiments here use three metrics to arrive at the optimum CTLE using the equalized step and frequency responses. The first metric comprises analysis of $Q_i(t)$ from Eq(2), away from the transition to check for over-equalization. Based on this metric, only those recreated step responses are retained from the original set of step responses for all candidate CTLEs that have sufficiently high amplitude in the portion of the response away from the transition.

Figure 11:
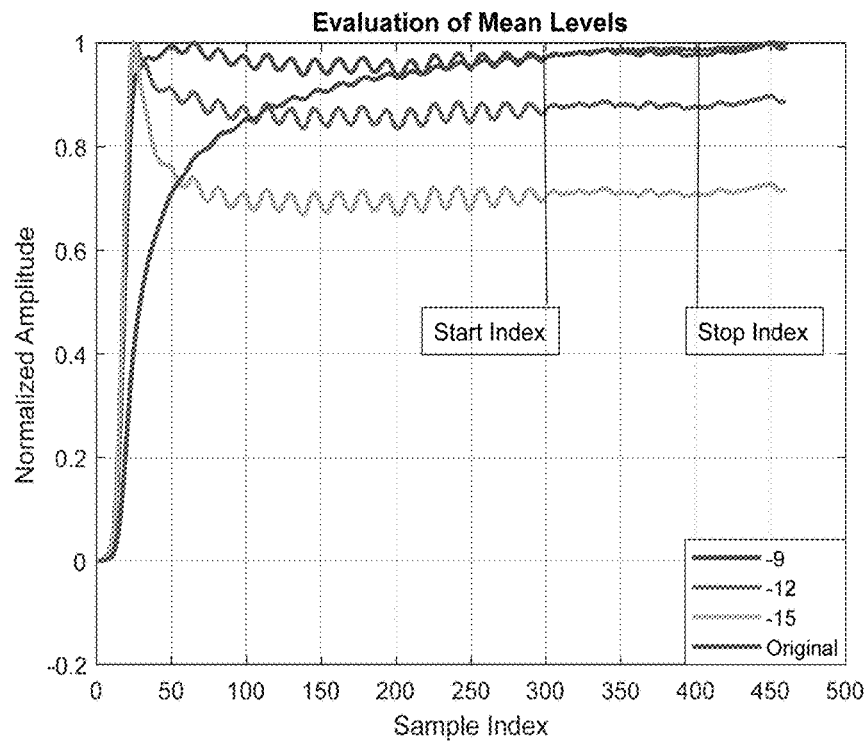
FIG. 11 show a graph of a mean level computation away from the transition using original and equalized step responses.

Over-equalization will reduce the amplitude of $Q_i(t)$ away from the transition and results in undershoot as seen in FIG. 11, something which is undesirable. This step computes the mean level of the original channel step response S(t) and that of $Q_i(t)$: i=1 to N, away from the transition. Let us assume M-samples over which the means are computed. FIG. 11 shows an example where M-samples between the Start Index and Stop Index are used to carry out measurements.

FIG. 11 shows a mean level computation away from the transition using original and equalized step responses, S(t) and $Q_i(t)$:i=1 to 3 respectively.

$$\text{Mean}_{S(t)} = \frac{1}{M} \sum_{n=\text{Start Index}}^{\text{Stop Index}} S(n)$$

$$\text{Mean}_{Q_i(t)} = \frac{1}{M} \sum_{n=\text{Start Index}}^{\text{Stop Index}} Q_i(n) \quad \forall i: 1 \to N$$

The normalized difference between $\text{Mean}_{S(t)}$ and $\text{Mean}_{Q_i(t)}$ $\forall i: 1 \to N$ is computed as shown below.

$$\text{Normalized Difference}(i) = \frac{|\text{Mean}_{S(t)} - \text{Mean}_{Q_i(t)}|}{\text{Mean}_{S(t)}} \quad \forall i: 1 \to N$$

Only those CTLE with ADC_Gain whose Normalized Difference parameter is less than certain threshold is retained for further processing. At the end of this first set of steps, the method have a reduced set of candidate CTLEs (say $N_1 < N$) which have very well controlled undershoot behavior of the equalized impulse response.

A second metric comprises error energy analysis of the equalized frequency response $P_1(\omega)$ relative to the original. In theory, the equalized frequency response should be a flat line in the frequency domain at least up to the frequency range of interest. However, in practice there is only a finite improvement that is possible as shown in FIG. 8. Let the original channel frequency response be denoted by $R(\omega) = \text{FFT}\{r(t)\}$, where $r(t)$ is the original channel impulse response. In this step, squared difference between the magnitude of original frequency response and each of the equalized frequency responses $P_i(\omega)$: $i=1$ to $N_1$ over a frequency interval is computed shown in FIG. 11 as an example.

FIG. 11 shows a calculation of the magnitude of difference in original frequency response $R(\omega)$ and candidate frequency responses $P_i(\omega)$: $i=1$ to $N_1$. The procedure computes the square of the difference between $R(\omega)$ and $P_i(\omega)$ or the error energy as shown below over the K-frequency bins in the interval shown in FIG. 11.

$$\text{Error Energy}(i) = \sum_{k=0}^{K} [R(k) - P_i(k)]^2 \quad \forall i: 1 \to N_1$$

Also, let us define Max_Error Energy $\triangleq$ maximum(Error Energy(i))

The normalized difference between Error Energy(i)$\forall i$: $1 \to N_1$ and the Max_Error Energy is computed as shown below.

$$\text{Normalized Energy Difference}(i) = \frac{|\text{Error Energy}(i) - \text{Max\_Error Energy}|}{\text{Max\_Error Energy}} \quad \forall i: 1 \to N_1$$

The Normalized Energy Difference (i)$\forall i$: $1 \to N_1$ is compared against a pre-defined threshold to prune the set of candidate CTLEs to a further reduced set of $N_2$-CTLEs. At the end of this second set of steps, the method have $N_2$-CTLEs ($N_2 < N_1 < N$) which have very well controlled undershoot behavior of the equalized impulse response as well as better equalization of the channel over a pre-defined interval of frequencies in the channel response.

The third metric uses DC, or steady state, level maximization in $P_i(\omega) \forall i$: $1 \to N_2$ for the best steady state performance. A comparison of $R(\omega)$ and $P_i(\omega) \forall i$: $1 \to N_2$ at $\omega=0$, is indicative of how well the steady state values of the equalized channel step response aligns with that of the original. This step is important to eliminate any candidate CTLEs that causes peaking at frequencies other than at DC or very close to that. The frequency response plot with example equalized frequency response after using $-9$ dB and $-15$ dB CTLE along with the original channel frequency response is shown in FIG. 12 to highlight this point.

Figure 12:
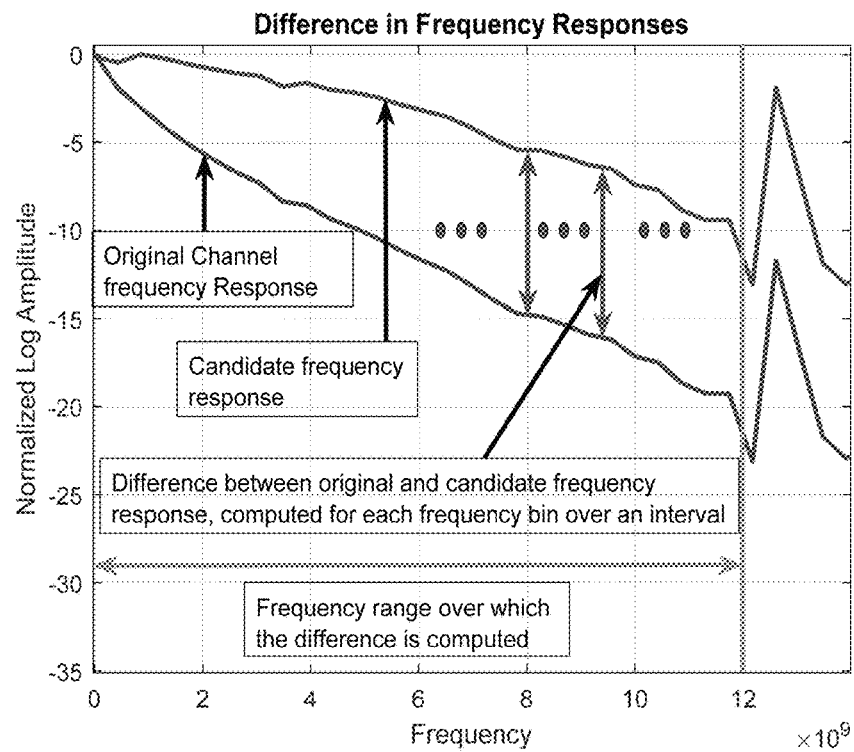
FIG. 12 shows a graph of calculation of the magnitude of difference in original frequency response R($\omega$) and candidate frequency responses.

FIG. 12 shows a comparison of steady state response between two candidate CTLEs relative to the original in frequency domain. The DC value of the frequency responses $P_i(\omega)$ is measured as shown below along with the maximum $$DC \text{ Value}(i) = P_i(0) \forall i: 1 \to N_2$$

$$\text{Maximum } DC \text{ Val} = \text{maximum}(DC \text{ Value}(i)) \forall i: 1 \to N_2$$

The normalized difference between the Maximum DC Val and each DCValue(i) is computed and compared with a threshold to prune the already reduced set of candidate CTLEs $$\text{Normalized } DC \text{ Val Diff}(i) = \frac{|DC \text{ Value}(i) - \text{Maximum } DC \text{ Val}|}{\text{Maximum } DC \text{ Val}} \quad \forall i: 1 \to N_1$$

Figure 13:
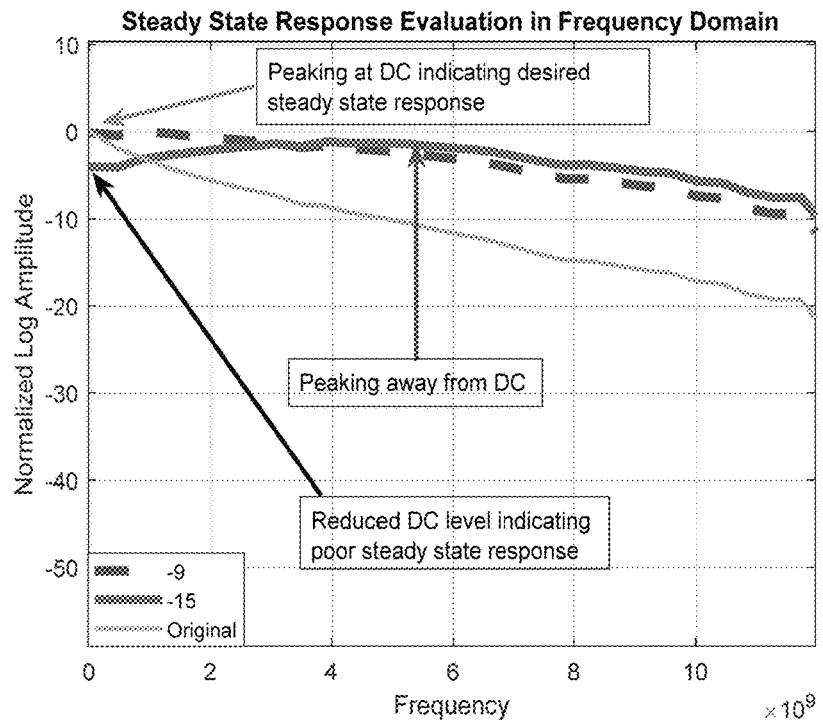
FIG. 13 shows a comparison of steady state response between two candidate CTLEs relative to the original in frequency domain.
Figure 14:
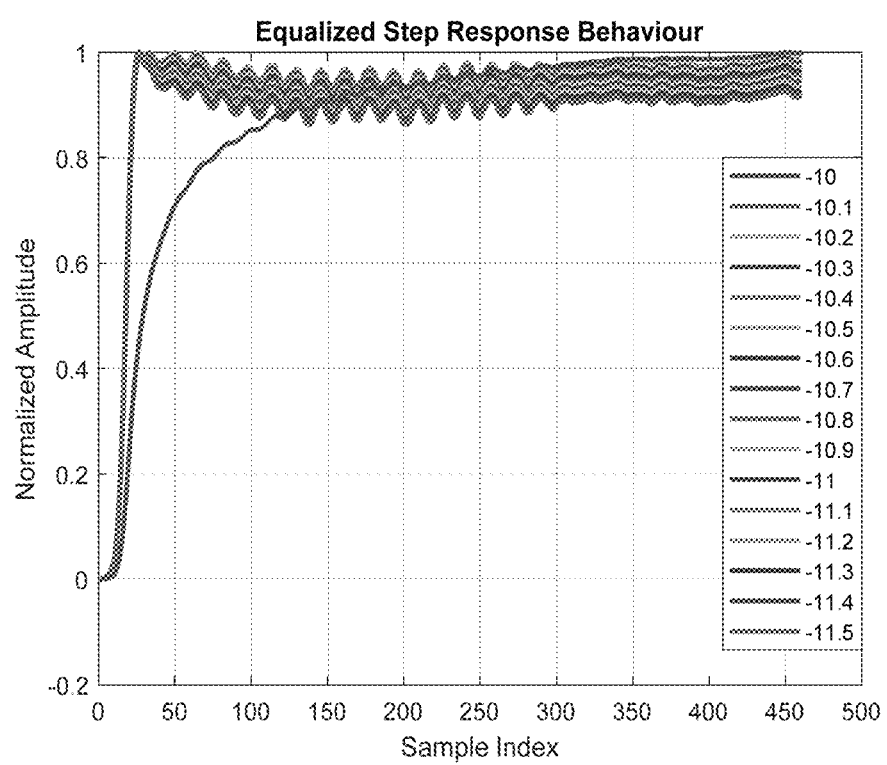
FIG. 14 shows example equalized step responses with the original.

At the end of the third set of steps, the CTLE with minimum |ADC_Gain| is chosen as the optimum CTLE As an example, consider candidate CTLEs between $-10$ dB to $-12$ dB with resolution of $-0.1$ dB to optimally equalize the example PCIe Gen 5, 32 GTps physical channel as shown in FIG. 13, with the equalized step responses overlaid. FIG. 14 shows an example equalized step responses with the original.

The application of the embodiments automatically selects the optimum CTLE from the initial set, with almost indistinguishable equalized step responses. The final CTLE selected is $-10.9$ dB with the responses shown in FIGS. 15 and 16.

Figure 15:
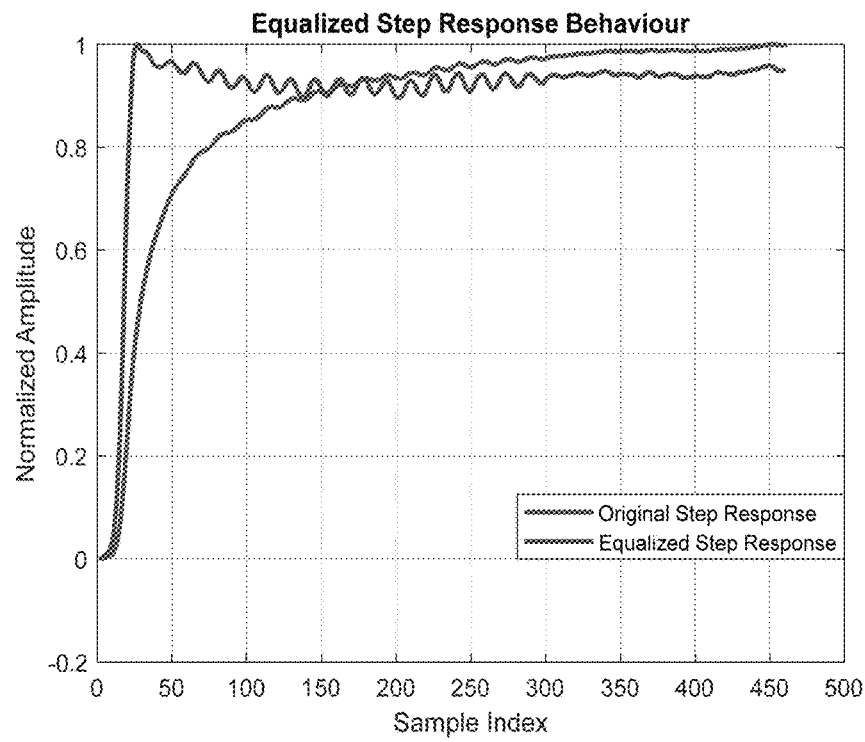
FIG. 15 shows an optimized step response at the output of selected CTLE.
Figure 16:
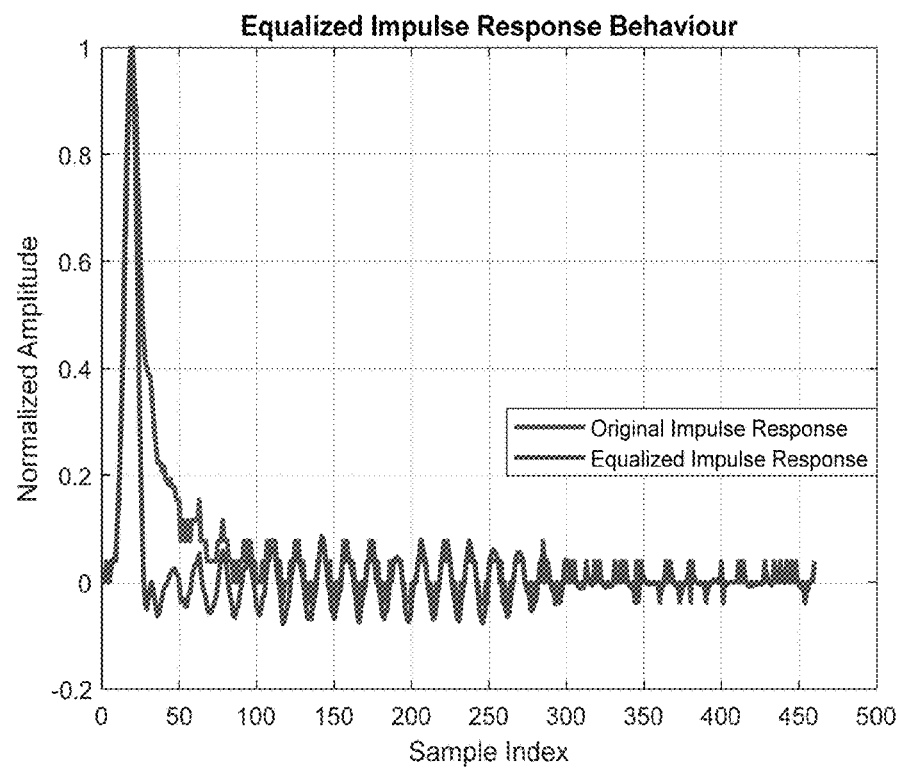
FIG. 16 shows an optimized impulse response of the channel at the output of selected CTLE.

FIG. 15 shows an optimized step response at the output of selected CTLE and FIG. 16 shows an optimized impulse response of the channel at the output of selected CTLE.

Figure 17:
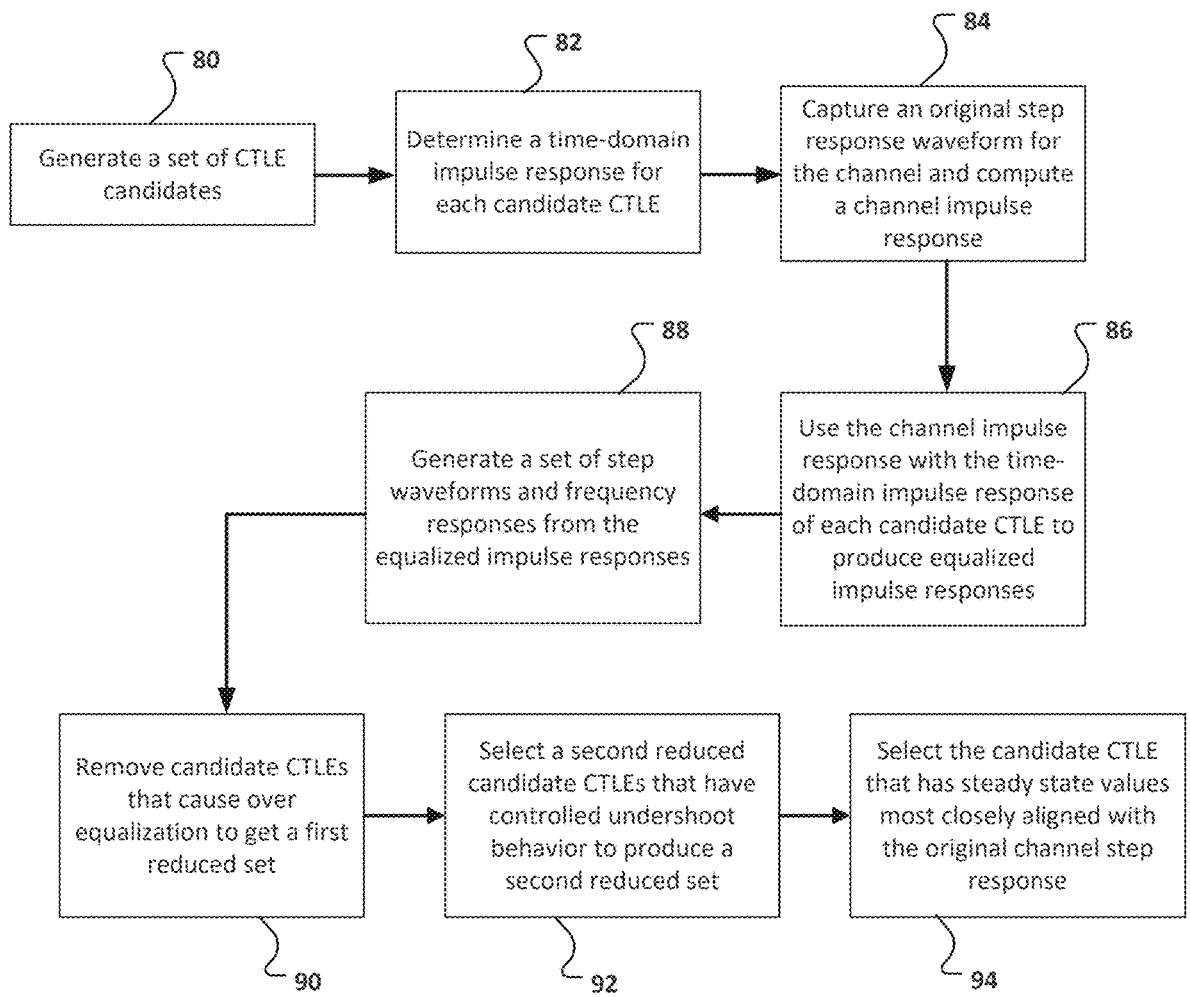
FIG. 17 shows an embodiment of an overall process for automatic CTLE selection.

FIG. 17 shows an embodiment of an overall process for automatic CTLE selection. At 80, the process begins with the generation of a set of candidate CTLEs. One embodiment of the generation comprises varying ADC_Gain with user-defined granularity.

At 82 the process determines time-domain impulse response of each CTLE. One embodiment uses an Inverse Fast Fourier Transform of ($h_i(t)$) and saves the set in memory. At 84, the process captures step response waveform (S(t)), normalizes it and computes its impulse response, r(t).

At 86, the process then generates a number of equalized results $p_i(t)$. In one embodiment, this comprises convolving impulse response of the channel and N CTLE using Eq (1). At 88, the process generates a set of step waveforms and frequency responses from the equalized impulse responses for all candidate CTLEs. In one embodiment, this is achieved using Eq (2) and Eq (3), Once the process has the individual step waveforms and frequency responses for each candidate CTLE, it begins to narrow down the optimal CTLE. At 90, candidate CTLEs that cause over equalization are eliminated or removed from the set, producing a first reducing set of candidates. In one embodiment, these candidates to be removed are identified by analyzing the equalized step waveforms ($Q_i(t)$) as described above.

The process then further reduces the set of candidate CTLEs by selecting those set of CTLE candidates remaining in the set that have controlled undershoot behavior in the equalized impulse response 90. Candidate CTLEs that do not have this behavior are removed from the set and the ones that do are kept. In one embodiment, the process analyzes the equalized frequency response ($P_i(\omega)$). This produces a second reduced set at 92.

From that set, the process eliminates any CTLE candidate that causes peaking at frequencies other than at DC or very close to that. In one embodiment, this is done by analyzing the equalized frequency response ($P_i(\omega)$). The CTLE that has steady state values aligned with the original channel step response is selected, which is the CTLE with minimum |ADC_Gain| is chosen as the optimal CTLE at 94. Once the optimal CTLE is determined, the process continues to apply the optimal CTLE to the protocol traffic, which can then be decoded.

In this manner, the embodiments provide an automated method of determining the optimal CTLE for the transmitter link equalization tests for communication channels in devices that need to adhere to a standard. The embodiments eliminate the long, manual process that increases the time and costs of testing to verify devices.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 comprises a method of automatically selecting a continuous time linear equalization (CTLE) filter, comprising: capturing a response waveform for a channel for a communication link for a device under test (DUT); generating a set of candidate CTLEs; and automatically selecting the CTLE from the set of candidate CTLEs using the step response waveform.

Example 2 comprises the method of Example 1, wherein automatically selecting the CTLE comprises: determining a time-domain impulse response for each candidate CTLE; computing a channel impulse response from the response waveform; using the channel impulse response with the time-domain impulse response of each candidate CTLE to produce an equalized impulse response for each candidate CTLE; generating a set of step waveforms and frequency responses from the equalized impulse responses for each candidate CTLE; reducing a number of the candidate CTLEs in the set; and selecting the CTLE that has steady state values most closely aligned with the original channel response.

Example 3 comprises the method of either of Examples 1 or 2, wherein generating a set of candidate CTLEs comprises varying an analog-to-digital converter gain across a range a values with a value step size based upon a user input.

Example 4 is the method of Example 2, wherein determining the time-based impulse response for each candidate CTLE comprises applying an inverse Fast Fourier Transform to each candidate CTLE.

Example 5 is the method of any of Examples 1 through 4, wherein capturing the response waveform includes capturing a step response waveform of the channel normalizing the step response waveform by selecting only samples from the step response waveform for analysis that capture transient and steady state portions of the step response waveform, and normalizing the y-axis to fall within the range [0, 1].

Example 6 is the method of Example 2, wherein using the channel impulse response and the impulse response of each candidate CTLE comprises convolving the channel impulse response with the time-domain impulse response for each candidate CTLE.

Example 7 is the method of Example 2, wherein generating the set of step waveforms from the equalized impulse responses comprises re-creating the step waveform for each candidate CTLE from the equalized impulse response for that candidate CTLE.

Example 8 is the method of Example 2, wherein reducing the number of candidate CTLEs in the set comprises: removing candidate CTLEs from the set that cause over-equalization; and keeping only the candidate CTLEs from the candidate CTLEs remaining in the set that have controlled undershoot behavior.

Example 9 is the method of Example 2, wherein selecting the CTLE that has steady state values most closely aligned with the original channel step response comprises: finding a steady-state value for the frequency responses for each candidate CTLE; determining a maximum steady-state value from the steady-state values of the candidate CTLEs; determining a normalized difference between the maximum steady-state value and the steady-state value for each candidate CTLE; and selecting the candidate CTLE with the minimum analog-to-digital converter gain. Example 10 is the method as claimed in any of Examples 1 through 9, further comprising: starting a transmitter link equalization test for a device under test (DUT); and initiating link training for the DUT;

Example 11 is a test and measurement instrument, comprising: a user interface; a port to allow the instrument to connect to a device under test (DUT); and one or more processors configured to execute code to cause the one or more processors to: generate a set of CTLE candidates; capture a response waveform for the channel; and automatically select the CTLE from the set of candidate CTLEs using the response waveform.

Example 12 is the instrument of Example 11, wherein the code to cause the one or more processors to automatically select the CTLE from the set of candidate CTLEs causes one or more processors to: determine a time-domain impulse response for each candidate CTLE; compute a channel impulse response from the response waveform of the channel; use the channel impulse response with the time-domain impulse response of each candidate CTLE to produce an equalized impulse response for each candidate CTLE; generate a set of step waveforms and frequency responses from the equalized impulse responses for each candidate CTLE; reduce a number of the candidate CTLEs in the set; and select the candidate CTLE that has steady state values most closely aligned with the channel step response as the selected CTLE.

Example 13 is the instrument of either of Examples 11 or 12, wherein the code to cause the one or more processors to generate a set of CTLE candidates comprises code to cause the one or more processors to vary an analog-to-digital converter gain across a range a values with a value step size based upon a user input.

Example 14 is the instrument of Example 12, wherein the code to cause the one or more processors to determine the time-based impulse response for each candidate CTLE comprises code to cause the one or more processors to apply an inverse Fast Fourier Transform to each candidate CTLE.

Example 15 is the instrument of any of Examples 11 through 14, wherein the code to cause the one or more processors to capture the response waveform of the channel includes code to cause the one or more processors to capture a step response waveform of the channel and normalize the step response waveform of the channel.

Example 16 is the instrument of Example 12, wherein the code to cause the one or more processors to use the channel impulse response and the impulse response of each candidate CTLE comprises code to cause the one or more processors to convolve the channel impulse response with the time-domain impulse response for each candidate CTLE.

Example 17 is the instrument of Example 12, wherein the code to cause the one or more processors to generate the set of step waveforms from the equalized impulse responses comprises code to cause the one or more processors to re-create the step waveform for each candidate CTLE from the equalized impulse response for that candidate CTLE.

Example 18 is the instrument of Example 12, wherein the code to cause the one or more processors to generate the frequency response for each candidate CTLE comprises code to cause the one or more processors to apply a Fast Fourier Transform to the equalized impulse response for each candidate CTLE.

Example 19 is the instrument of Example 12, wherein the code to cause the one or more processors to reduce a number of the candidate CTLEs in the set comprises code to cause the one or more processors to: remove candidate CTLEs in the set that cause over-equalization; and keep only the candidate CTLEs that have controlled undershoot behavior.

Example 20 is the instrument of any of Examples 11 through 19, wherein the code to cause the one or more processors to select the candidate CTLE that has steady state values most closely aligned with the channel response comprises code to cause the one or more processors to: find a steady-state value for the frequency responses for each candidate CTLE; determine a maximum steady-state value from the steady-state values of the candidate CTLEs; determine a normalized difference between the maximum steady-state value and the steady-state value for each candidate CTLE; and identify the candidate CTLE with the minimum analog-to-digital converter gain as the selected CTLE.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific embodiments have been illustrated and described for purposes of illustration, it will be understood that various modifications may be made without departing from the spirit and scope of the disclosure. Accordingly, the invention should not be limited except as by the appended claims.

We claim:

1. A method of automatically selecting a continuous time linear equalization (CTLE) filter for a communication link equalization, comprising:
capturing a signal transmitted over the communication link;
receiving, through a user interface, a user-defined granularity for direct current (DC) gain steps for one or more analog-to-digital converters (ADC);
generating a set of candidate CTLEs by varying the direct current gain across a range of DC values as the user-defined granularity for the one or more ADCs;
using the one or more ADCs to generate a response waveform for a channel in a communications link for each of the candidate CTLEs;
automatically selecting the CTLE from the set of candidate CTLEs using the response waveform; and
applying the CTLE to protocol traffic to equalize the channel on the communication link to improve traffic on the channel.

2. The method as claimed in claim 1, wherein automatically selecting the CTLE comprises:
determining a time-domain impulse response for each candidate CTLE;
computing a channel impulse response from the response waveform;
using the channel impulse response with the time-domain impulse response of each candidate CTLE to produce an equalized impulse response for each candidate CTLE;
generating a set of step waveforms and frequency responses from the equalized impulse responses for each candidate CTLE;
reducing a number of the candidate CTLEs in the set; and
selecting the CTLE that has steady state values most closely aligned with the original channel response.

3. The method as claimed in claim 2, wherein determining the time-domain impulse response for each candidate CTLE comprises applying an inverse Fast Fourier Transform to each candidate CTLE.

4. The method as claimed in claim 2, wherein using the channel impulse response and the impulse response of each candidate CTLE comprises convolving the channel impulse response with the time-domain impulse response for each candidate CTLE.

5. The method as claimed in claim 2, wherein generating the set of step waveforms from the equalized impulse responses comprises re-creating the step waveform for each candidate CTLE from the equalized impulse response for that candidate CTLE.

6. The method as claimed in claim 2, wherein reducing the number of candidate CTLEs in the set comprises:
removing candidate CTLEs from the set that cause over-equalization; and
keeping only the candidate CTLEs from the candidate CTLEs remaining in the set that have controlled under-shoot behavior.

7. The method as claimed in claim 2, wherein selecting the CTLE that has steady state values most closely aligned with the original channel response comprises:
finding a steady-state value for the frequency responses for each candidate CTLE;
determining a maximum steady-state value from the steady-state values of the candidate CTLEs;
determining a normalized difference between the maximum steady-state value and the steady-state value for each candidate CTLE; and
selecting the candidate CTLE with the minimum analog-to-digital converter gain.

8. The method as claimed in claim 1, wherein capturing the response waveform includes acquiring a step response waveform of the channel and normalizing the step response waveform by selecting only samples from the step response waveform for analysis that capture transient and steady state portions of the step response waveform, and normalizing the y-axis to fall within the range [0, 1].

9. The method as claimed in claim 1, further comprising:
starting a transmitter communications link equalization test for a device under test (DUT); and
initiating link training for the DUT.

10. A test and measurement instrument, comprising:
a user interface;
a port to allow the instrument to connect to a device generating a signal on a communication link;
one or more analog-to-digital converters (ADC) to receive the signal and convert the signal to a digitized waveform; and
one or more processors configured to execute code to cause the one or more processors to:
receive, through the user interface, a user-defined granularity for a direct current (DC) gain;
generate a set of continuous time linear equalization filter (CTLE) candidates by varying the DC gain across a range of DC values at the user-defined granularity for the one or more ADCs;
capture a response waveform for the channel;
automatically select the CTLE from the set of candidate CTLEs using the response waveform for the channel;
apply the CTLE to protocol traffic on the communication link to equalize the channel and improve the protocol traffic.

11. The instrument as claimed in claim 10, wherein the code to cause the one or more processors to automatically select the CTLE from the set of candidate CTLEs causes one or more processors to:
determine a time-domain impulse response for each candidate CTLE;
compute a channel impulse response from the response waveform of the channel;
use the channel impulse response with the time-domain impulse response of each candidate CTLE to produce an equalized impulse response for each candidate CTLE;
generate a set of step waveforms and frequency responses from the equalized impulse responses for each candidate CTLE;
reduce a number of the candidate CTLEs in the set; and
select the candidate CTLE that has steady state values most closely aligned with the channel response as the selected CTLE.

12. The instrument as claimed in claim 11, wherein the code to cause the one or more processors to determine the time domain impulse response for each candidate CTLE comprises code to cause the one or more processors to apply an inverse Fast Fourier Transform to each candidate CTLE.

13. The instrument as claimed in claim 11, wherein the code to cause the one or more processors to use the channel impulse response and the impulse response of each candidate CTLE comprises code to cause the one or more processors to convolve the channel impulse response with the time-domain impulse response for each candidate CTLE.

14. The instrument as claimed in claim 11, wherein the code to cause the one or more processors to generate the set of step waveforms from the equalized impulse responses comprises code to cause the one or more processors to re-create the step waveform for each candidate CTLE from the equalized impulse response for that candidate CTLE.

15. The instrument as claimed in claim 11, wherein the code to cause the one or more processors to generate the frequency response for each candidate CTLE comprises code to cause the one or more processors to apply a Fast Fourier Transform to the equalized impulse response for each candidate CTLE.

16. The instrument as claimed in claim 11, wherein the code to cause the one or more processors to reduce a number of the candidate CTLEs in the set comprises code to cause the one or more processors to:
   remove candidate CTLEs in the set that cause over-equalization; and
   keep only the candidate CTLEs that have controlled undershoot behavior.

17. The instrument as claimed in claim 10, wherein the code to cause the one or more processors to capture the response waveform of the channel includes code to cause the one or more processors to capture a step response waveform of the channel and normalize the step response waveform of the channel.

18. The instrument as claimed in claim 10, wherein the code to cause the one or more processors to select the candidate CTLE that has steady state values most closely aligned with the channel response comprises code to cause the one or more processors to:
   find a steady-state value for the frequency responses for each candidate CTLE;
   determine a maximum steady-state value from the steady-state values of the candidate CTLEs;
   determine a normalized difference between the maximum steady-state value and the steady-state value for each candidate CTLE; and
   identify the candidate CTLE with the minimum analog-to-digital converter gain as the selected CTLE.

\* \* \* \* \*